US008335102B2

(12) United States Patent
Murooka

(10) Patent No.: US 8,335,102 B2
(45) Date of Patent: Dec. 18, 2012

(54) RESISTANCE CHANGE MEMORY

(75) Inventor: Kenichi Murooka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 124 days.

(21) Appl. No.: 13/071,943

(22) Filed: Mar. 25, 2011

(65) Prior Publication Data

US 2011/0228589 A1    Sep. 22, 2011

Related U.S. Application Data

(63) Continuation of application No. PCT/JP2008/068184, filed on Oct. 6, 2008.

(51) Int. Cl.
*G11C 11/00* (2006.01)
(52) U.S. Cl. ......... 365/148; 365/158; 365/171; 365/173
(58) Field of Classification Search .................. 365/148, 365/158, 171, 173
See application file for complete search history.

(56) References Cited

U.S. PATENT DOCUMENTS

| 7,400,522 B2 * | 7/2008 | Toda et al. .................... 365/148 |
| 2002/0130331 A1 | 9/2002 | Nemoto |

FOREIGN PATENT DOCUMENTS

| JP | 57-2580 | 1/1982 |
| JP | 2002-184782 | 6/2002 |
| JP | 2003-152198 | 5/2003 |
| WO | WO 2008/105155 | 9/2008 |

OTHER PUBLICATIONS

U.S. Appl. No. 13/001,147, filed Dec. 23, 2010, Murooka.
International Preliminary Report on Patentability and Written Opinion of the International Searching Authority issued May 26, 2011, in Patent Application No. PCT/JP2008/068184 filed Oct. 6, 2008.
International Search Report issued Dec. 22, 2008 in International Application No. PCT/JP2008/068184 (with English Translation).
International Written Opinion issued Dec. 22, 2008 in International Application No. PCT/JP2008/068184.
Shinichiro Kimura, "Semiconductor Memory; DRAM", ULSI Research Department, Central Research Laboratory, vol. 69, No. 10, 2000, pp. 1233-1240.
Natsuo Ajika, "Flash memory, recent topics", Mitsubishi Electric Corporation, Semiconductor Group, Memory IC Division, Memory Process Design Department, vol. 69, No. 12, 2000, pp. 1462-1466.

* cited by examiner

*Primary Examiner* — Son Dinh
*Assistant Examiner* — Nam Nguyen
(74) *Attorney, Agent, or Firm* — Oblon, Spivak, McClelland, Maier & Neustadt, L.L.P.

(57) ABSTRACT

A memory includes memory cells each includes a resistance change element and a diode. The diode comprises areas which is provided in order of a first semiconductor area with a first conductivity type, a second semiconductor area with the first conductivity type, and a third semiconductor area with a second conductivity type, from the column lines to the row lines. An atom density of impurities with the first conductivity type in the second semiconductor area is lower than that in the first semiconductor area. The diode comprises a fourth semiconductor area with the first conductivity type at an end portion in a third direction of the second semiconductor area, the third direction is perpendicular to a direction from the column lines to the row lines, and an atom density of impurities with the first conductivity type in the fourth semiconductor area is higher than that in the second semiconductor area.

7 Claims, 11 Drawing Sheets

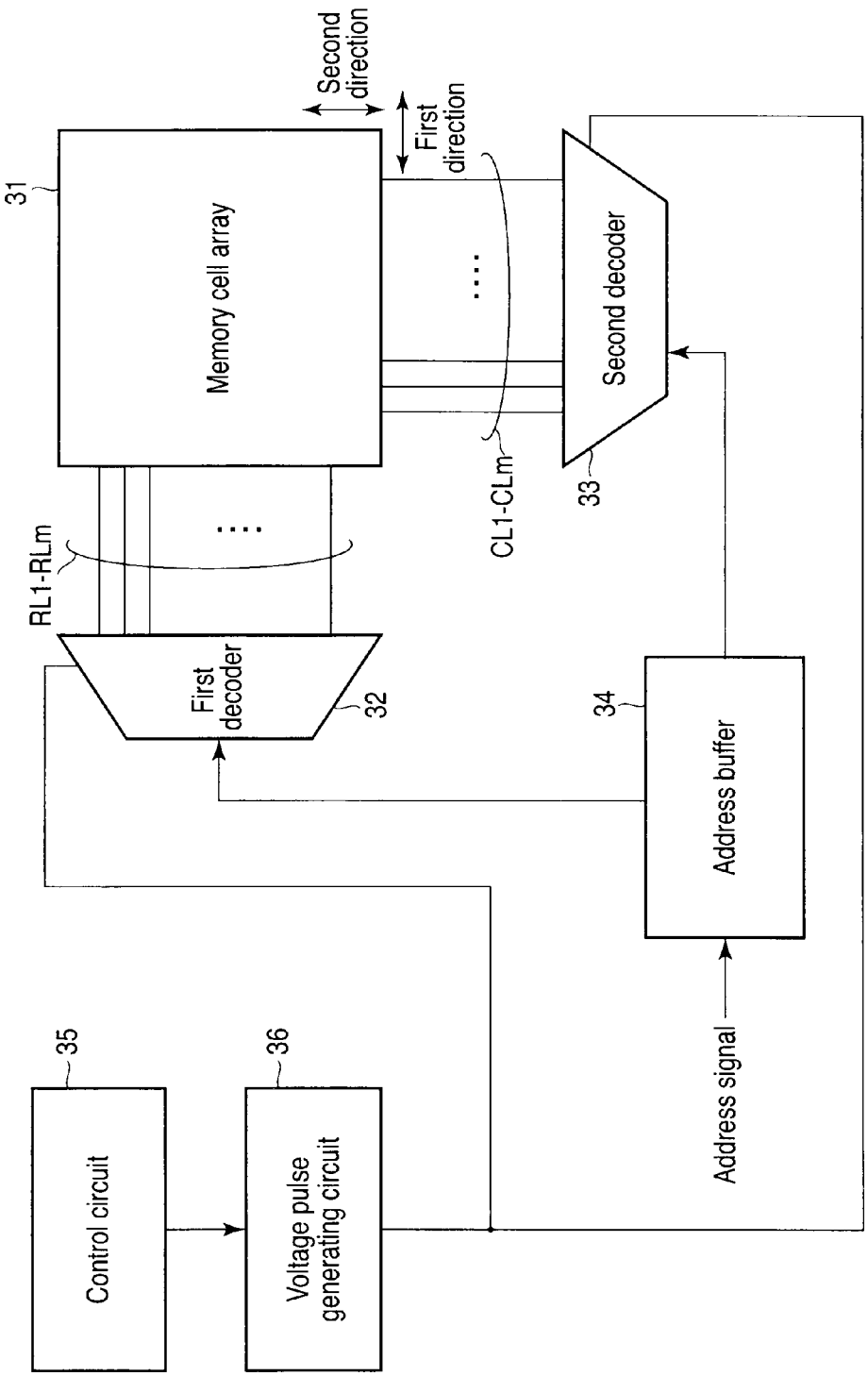
F I G. 1

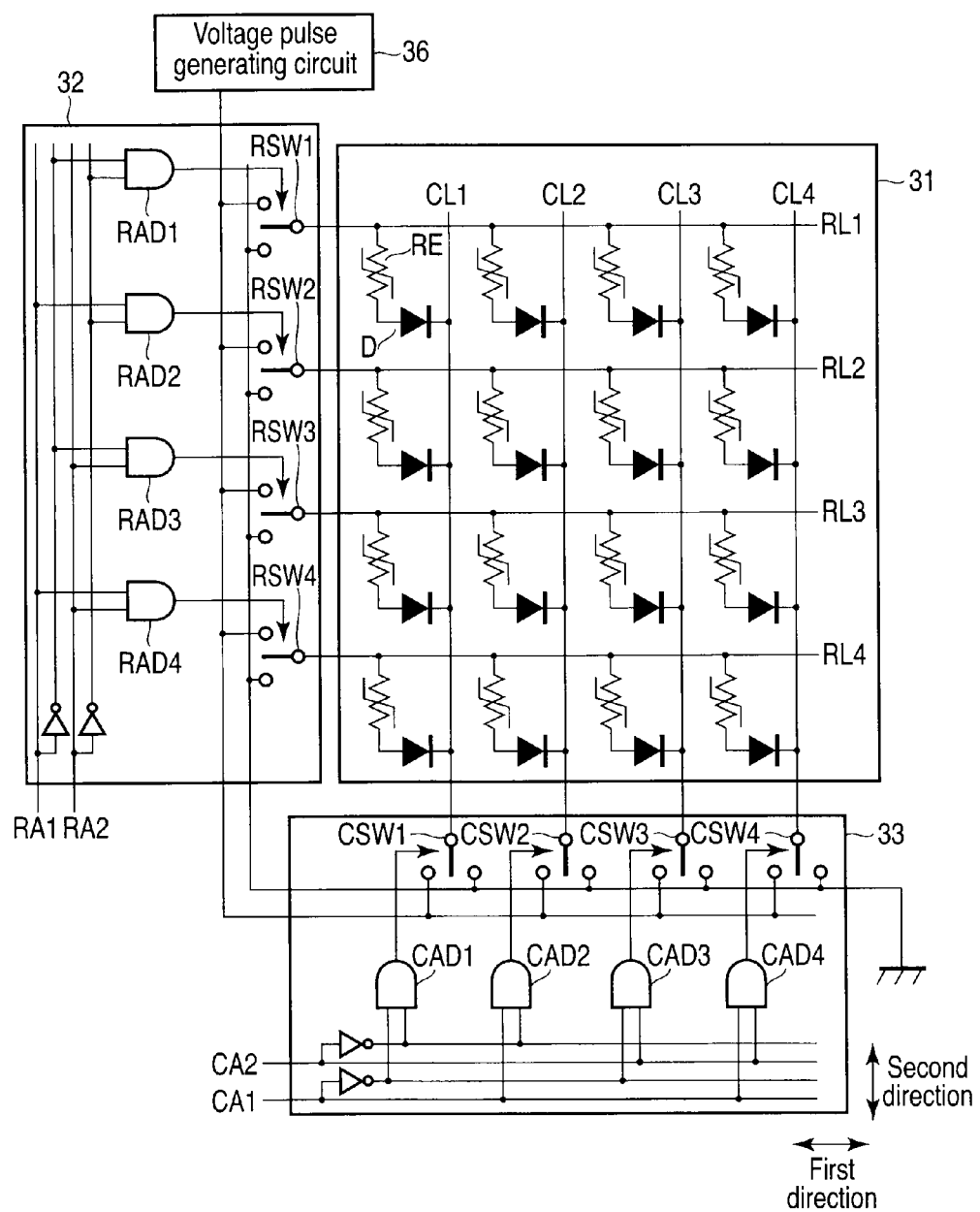
F I G. 2

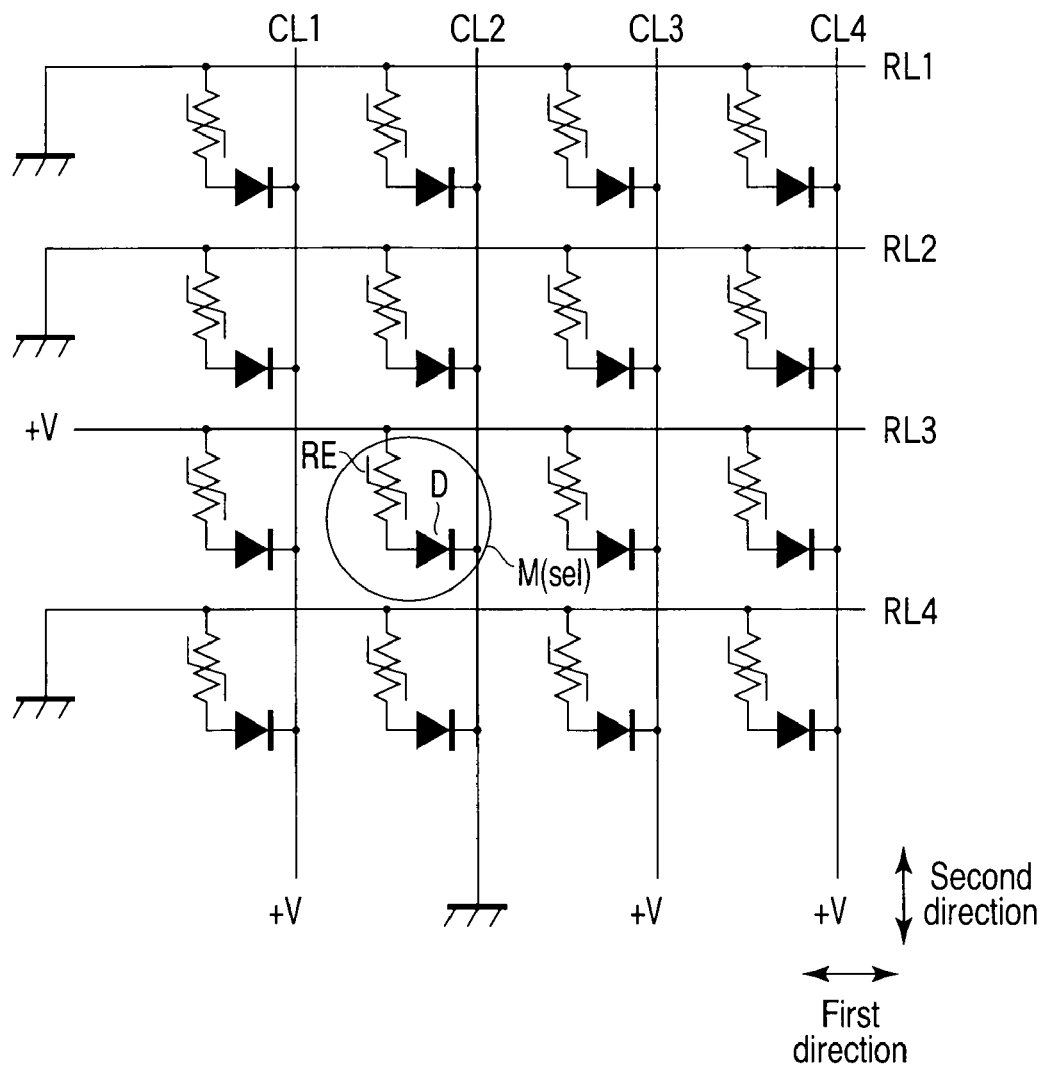
F I G. 3

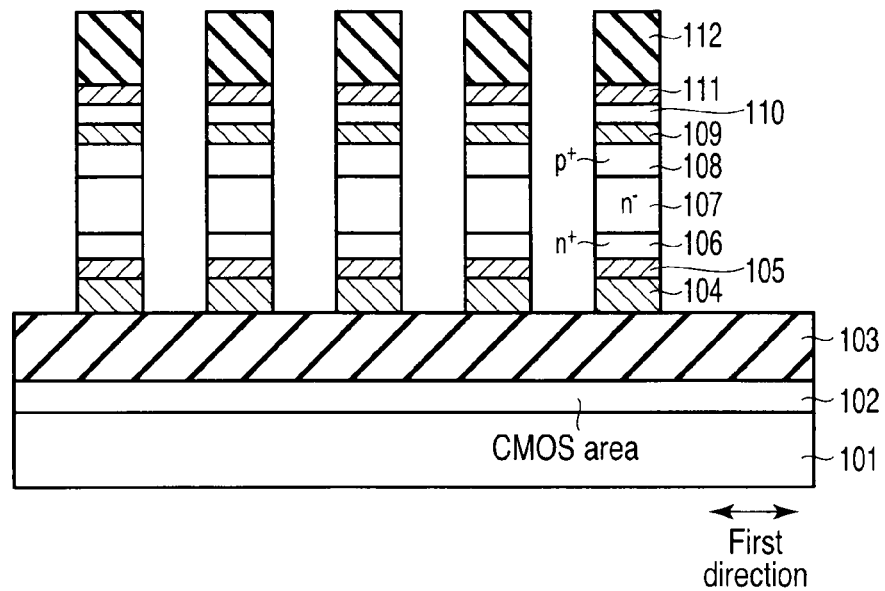
F I G. 12
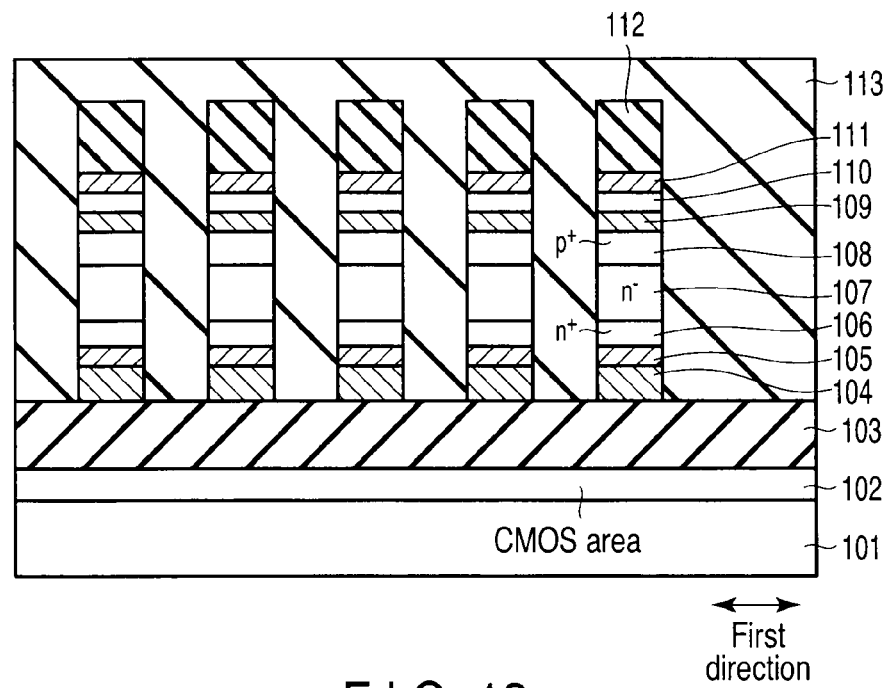
F I G. 13

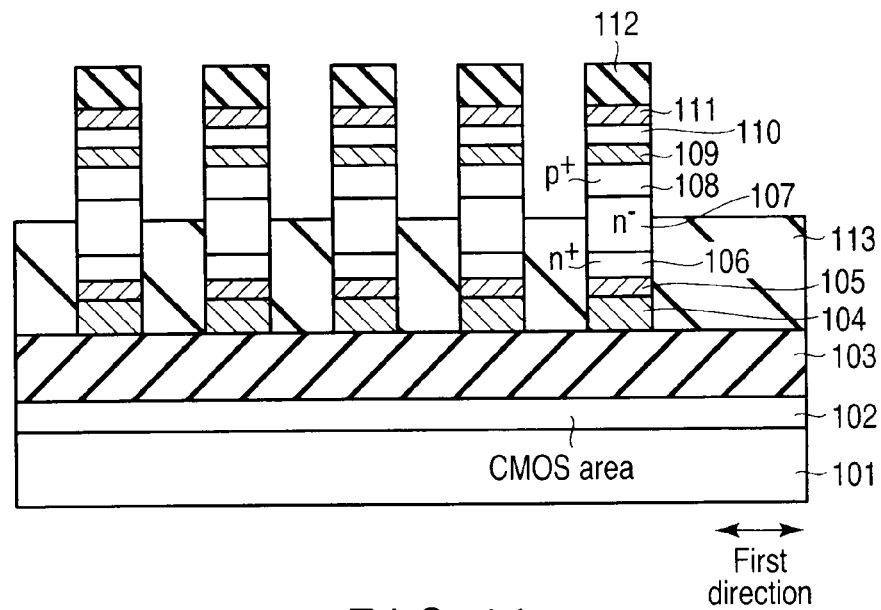
F I G. 14
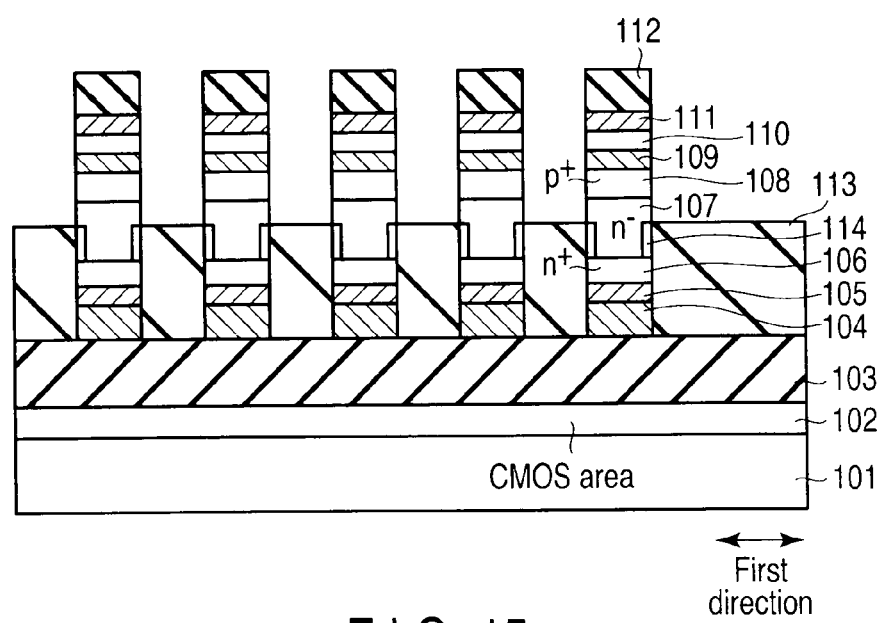
F I G. 15

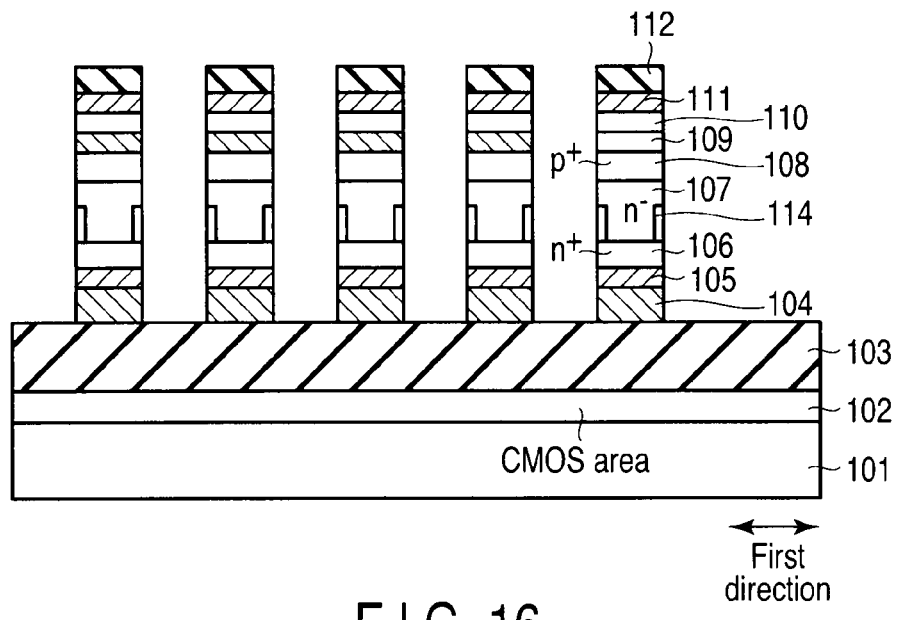
F I G. 16
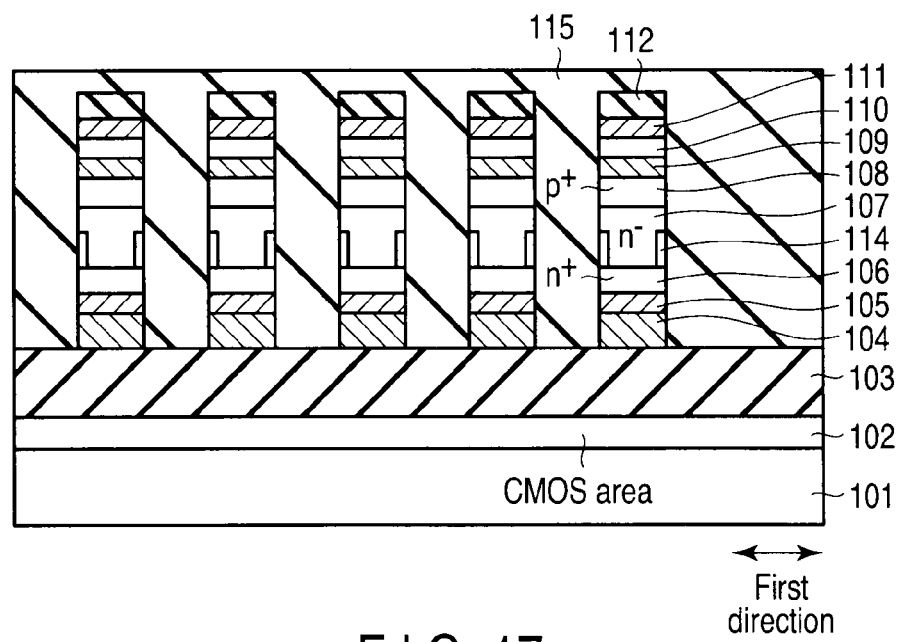
F I G. 17

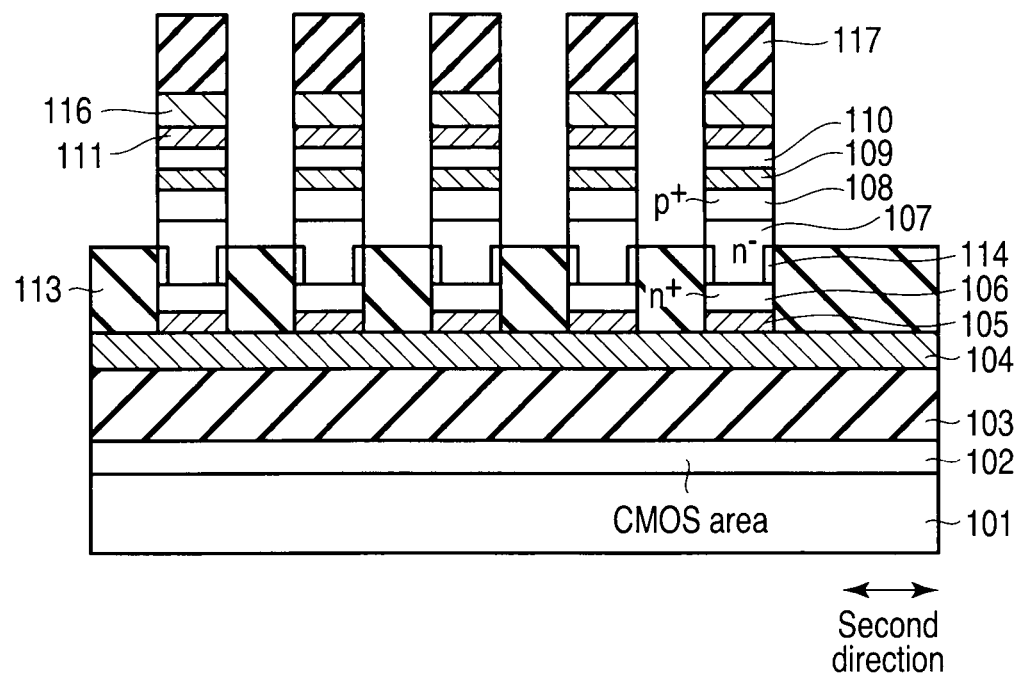
F I G. 20
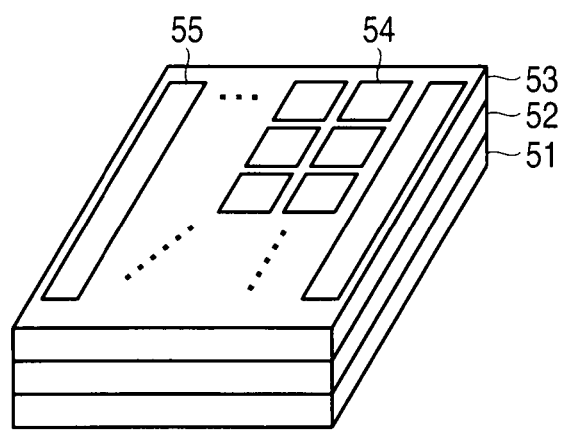
F I G. 21

RESISTANCE CHANGE MEMORY

CROSS-REFERENCE TO RELATED APPLICATIONS

This is a Continuation Application of PCT Application No. PCT/JP2008/068184, filed Oct. 6, 2008, which was published under PCT Article 21(2) in Japanese, the entire contents of which are incorporated herein by reference.

FIELD

Embodiments described herein relate generally to a resistance change memory using a resistance change element.

BACKGROUND

With the recent increase in the densities of the semiconductor devices, the sizes of circuit patterns of LSIs constituting the semiconductor devices are further reduced. In order to reduce the sizes of the patterns, it is necessary to not only reduce line widths but also improve the dimensional and positional accuracies of the patterns.

A storage device called a memory is not the exception. It is desired to maintain a specified number of charges required for storage in a smaller area in a cell formed using an accurate patterning technique.

Various semiconductor memories such as DRAMs, SRAMs, and flash memories have hitherto been manufactured. However, all of these memories employ MOSFETs as memory cells, so that the reduction in the size of the pattern is accompanied by a demand for an increase in the dimensional accuracy by a rate larger than that by which the size of the pattern is reduced.

Thus, a heavy burden has also been imposed on a lithography technique for forming these patterns. This in turn has increased the cost of a lithography process accounting for the major part of the present mass production cost, that is, the product cost.

On the other hand, in order to solve these problems, a memory called ReRAM (Resistive Random Access Memory) has been recently suggested. In the ReRAM, a memory cell is constituted by a nonohmic element such as a diode and a resistance change element.

The ReRAM can be achieved without using accumulated charges for storing information and without using MOSFETs for memory cells. Therefore, the ReRAM is expected to achieve a higher density than the density of the past trend.

By the way, in a diode used for a memory cell of the ReRAM, a tolerable value of a current flowing in a forward direction and a tolerable value of a leak current flowing in a backward direction need to respectively satisfy a certain standard based on the a property of a resistance change element. However, when the density increases, and the sizes of the memory cells are reduced, it is necessary to solve many technical problems in order to satisfy the certain standard.

For example, when a cell size (a size where a planar shape is assumed to be a square) is several dozen nanometers by several dozen nanometers, a large current of 1 μA or more is needed in a reset operation in which the memory cell changes from a low resistance state to a high resistance state.

A carrier scattering increases at the same time, which increases the loss, when the tolerable value of the current flowing in the forward direction is increased by increasing an atom density of an n-type impurity in an n⁻-type semiconductor area (cathode) of a diode in order to satisfy the standard.

On the other hand, when the diode is used as a selection element, this kind of reset operation is preferably performed with a small loss. However, in order to flow a large current through the diode with a small loss during the reset operation, it is necessary to reduce the atom density of the n-type impurity in the n⁻-type semiconductor area of the diode so as to reduce the carrier scattering of the current flowing in the forward direction.

In other words, the tolerable value of the current flowing in the forward direction and the loss caused by the carrier scattering are a tradeoff with regard to the atom density of the n-type impurity of the n⁻-type semiconductor area of the diode, and it is difficult to improve both of the tolerable value of the current flowing in the forward direction and the loss caused by the carrier scattering at the same time.

BRIEF DESCRIPTION OF THE DRAWINGS

FIGS. 1 and 2 show a resistance change memory.
FIG. 3 is a diagram for describing an operation of the resistance change memory.
FIGS. 7 to 20 are diagrams, each showing one step of a manufacturing method.
FIG. 21 shows an application example.

DETAILED DESCRIPTION

Figure 4:
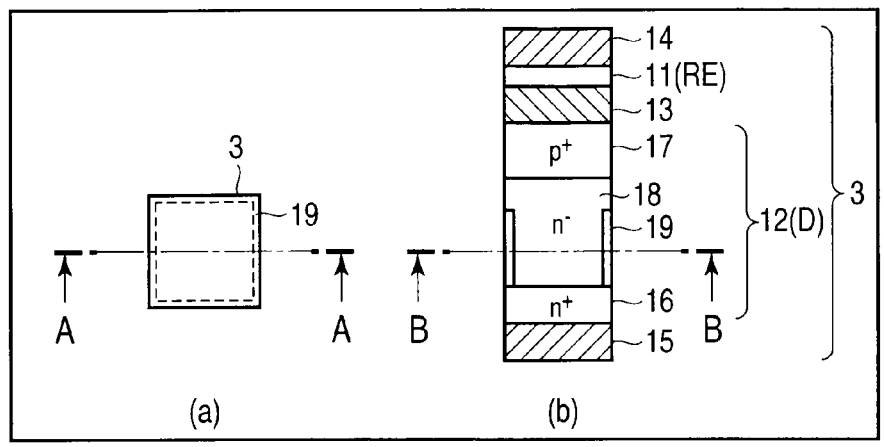
FIG. 4 shows a memory cell.

In general, according to one embodiment, a resistance change memory comprising: row lines extending in a first direction; column lines extending in a second direction cross to the first direction; memory cells each comprising a resistance change element and a diode connected in series, and each memory cell provided between one of the row lines and one of the column lines; a first decoder which selects one of the row lines as a selected row line; a second decoder which selects one of the column lines as a selected column line; and a voltage pulse generating circuit which generates a voltage pulse supplying between the selected row line and the selected column line in a writing, wherein the diode comprises areas which is provided in order of a first semiconductor area with a first conductivity type, a second semiconductor area with the first conductivity type, and a third semiconductor area with a second conductivity type, from the column lines to the row lines, wherein an atom density of impurities with the first conductivity type in the second semiconductor area is lower than that in the first semiconductor area, wherein the diode comprises a fourth semiconductor area with the first conductivity type at an end portion in a third direction of the second semiconductor area, the third direction is perpendicular to a direction from the column lines to the row lines, and an atom density of impurities with the first conductivity type in the fourth semiconductor area is higher than that in the second semiconductor area.

1. OUTLINE

Embodiments described herein relate to a so-called cross-point type resistance change memory in which a memory cell is provided between a row line and a column line crossing each other. In this kind of resistance change memory, a diode, i.e., a nonohmic element, is often connected in series with a resistance change element in order to prevent problems such as disturb and sensitivity reduction caused by a sneak current occurring during reading and writing operations.

However, even when the size of the memory cell is reduced, the magnitude of a current value per unit area for changing a resistance value of the resistance change element increases. Accordingly, this large current also flows through the diode. Therefore, it is necessary to increase the atom density of an n-type impurity in an $n^-$-type semiconductor area serving as the cathode of the diode and increase a tolerable value of a current flowing in the forward direction.

However, when the atom density of the n-type impurity in the n-type semiconductor area is increased, a carrier scattering increases at the same time. Accordingly, a current loss increases.

In the embodiment, in order to solve the tradeoff, the atom density of the n-type impurity is first determined with reduction of the current loss being regarded as the highest priority in the $n^-$-type semiconductor area (second semiconductor area) serving as a carrier transport area of a diode. In other words, the atom density of the n-type impurity in the $n^-$-type semiconductor area is reduced, and the carrier scattering of the current flowing in the forward direction is reduced.

The tolerable value of the current flowing in the forward direction is improved by providing another $n^-$-type semiconductor area (fourth semiconductor area) serving as a carrier supply area at an end portion of the $n^-$-type semiconductor area in a direction perpendicular to a direction from column lines to row lines (lamination direction), wherein in the fourth semiconductor area, the atom density of the impurity with the first conductivity type is higher than that in the n-type semiconductor area.

As described above, the other n-type semiconductor area (carrier supply area) is provided at an end portion of the $n^-$-type semiconductor area (carrier transport area) in the direction perpendicular to the direction from the column lines to the row lines, wherein in the carrier supply area, the atom density of the impurity with the first conductivity type is higher than that in the $n^-$-type semiconductor area. Therefore, this solves the tradeoff between the tolerable value of the current flowing through the diode in the forward direction and the loss caused by the carrier scattering.

In this specification, a row line, a column line, and a cell size are defined as follows.

The row line is a conductive line connected to an anode of a diode constituting a memory cell. The column line is a conductive line connected to a cathode of a diode constituting a memory cell. The cell size is a size of a planar shape of a memory cell (a shape in a plane parallel to a surface of a semiconductor substrate).

2. EMBODIMENT

(1) Overall View

FIG. 1 illustrates a resistance change memory according to the first embodiment.

First decoder 32 is arranged at one end in a first direction of memory cell array 31. Second decoder 33 is arranged at one end in a second direction crossing the first direction of memory cell array 31. Row lines RL1 to RLn (n is a natural number equal to or more than 2) extend in the first direction from first decoder 32. Column lines CL1 to CLm (m is a natural number equal to or more than 2) extend in the second direction from second decoder 33.

An address signal is input to address buffer 34 during reading/writing/erasing operations. A portion of the address signal is input to first decoder 32 from address buffer 34. Another portion of the address signal is input to second decoder 33 from address buffer 34.

First decoder 32 selects one of row lines RL1 to RLn based on the address signal. Second decoder 33 selects one of column lines CL1 to CLm based on the address signal.

During the writing operation (set), control circuit 35 outputs control signal CNT which permits generation of a voltage pulse.

When voltage pulse generating circuit 36 receives control signal CNT, voltage pulse generating circuit 36 generates a voltage pulse having a predetermined size (voltage value) and a predetermined width (duration).

The voltage pulse generated by voltage pulse generating circuit 36 is provided to a selected one of row lines RL1 to RLn via first decoder 32. In addition, the voltage pulse generated by voltage pulse generating circuit 36 is provided to unselected column lines of column lines CL1 to CLm via second decoder 33.

At this occasion, the unselected row lines and the selected column line are set at a fixed voltage, e.g., ground voltage.

(2) Partial View

FIG. 2 illustrates an exemplary circuit including a memory cell array, a first decoder, and a second decoder in the resistance change memory of FIG. 1.

In this example, it is assumed that there are four row lines and four column lines for the sake of brevity.

In memory cell array 31, four row lines RL1, RL2, RL3, RL4 extend in the first direction, and four column lines CL1, CL2, CL3, CL4 extend in the second direction. Each memory cell is provided between one of row lines RL1, RL2, RL3, RL4 and one of column lines CL1, CL2, CL3, CL4.

The memory cell includes resistance change element RE and diode D, which are connected in series.

Each of four row lines RL1, RL2, RL3, RL4 extends in the first direction, and is connected to resistance change elements RE connected to the anodes of diodes D. Each of four column lines CL1, CL2, CL3, CL4 extends in the second direction crossing the first direction, and is connected to the cathodes of diodes D.

Resistance change element RE is an element changing between at least two resistance values, e.g., a low resistance state and a high resistance state, and is made of one material selected from the group consisting of $ZnMn_2O_4$, NiO, $TiO_2$, $SrZrO_3$, $Pr_{0.7}Ca_{0.3}MnO_3$.

In memory cell array 31 as described above, row lines RL1, RL2, RL3, RL4 and column lines CL1, CL2, CL3, CL4 are simply made of a line-and-space pattern. Accordingly, it is not necessary to consider displacement of these upper and lower conductive lines.

Therefore, the accuracy of positioning within memory cell array 31 may be reduced to an extremely low level, which enables easy manufacturing of memory cell array 31.

First decoder 32 is constituted by switch circuits RSW1, RSW2, RSW3, RSW4 and AND circuits RAD1, RAD2, RAD3, RAD4.

For example, switch circuits RSW1, RSW2, RSW3, RSW4 and AND circuits RAD1, RAD2, RAD3, RAD4 are made of CMOS circuits.

When both of address signals RA1, RA2 are at the "L" level, the output signal of AND circuit RAD1 attains the "H" level, and switch circuit RSW1 electrically connects row line RL1 to pulse generating circuit 36. At this occasion, the output signals of AND circuits RAD2, RAD3, RAD4 are at the "L" level, and switch circuits RSW2, RSW3, RSW4 fix row lines RL2, RL3, RL4 at a fixed voltage (in this case, ground voltage).

When address signal RA1 is at the "H" level, and address signal RA2 is at the "L" level, the output signal of AND circuit RAD2 attains the "H" level, and switch circuit RSW2 electrically connects row line RL2 to pulse generating circuit 36. At this occasion, the output signals of AND circuits RAD1, RAD3, RAD4 are at the "L" level, and switch circuits RSW1, RSW3, RSW4 fix row lines L1, RL3, RL4 at the fixed voltage.

When address signal RA1 is at the "L" level, and address signal RA2 is at the "H" level, the output signal of AND circuit RAD3 attains the "H" level, and switch circuit RSW3 electrically connects row line RL3 to pulse generating circuit 36. At this occasion, the output signals of AND circuits RAD1, RAD2, RAD4 are at the "L" level, and switch circuits RSW1, RSW2, RSW4 fix row lines RL1, RL2, RL4 at the fixed voltage.

When both of address signals RA1, RA2 are at the "H" level, the output signal of AND circuit RAD4 attains the "H" level, and switch circuit RSW4 electrically connects row line RL4 to pulse generating circuit 36. At this occasion, the output signals of AND circuits RAD1, RAD2, RAD3 are at the "L" level, and switch circuits RSW1, RSW2, RSW3 fix row lines RL1, RL2, RL3 at the fixed voltage.

Second decoder 33 includes switch circuits CSW1, CSW2, CSW3, CSW4 and AND circuits CAD1, CAD2, CAD3, CAD4.

For example, switch circuits CSW1, CSW2, CSW3, CSW4 and AND circuits CAD1, CAD2, CAD3, CAD4 are made of CMOS circuits.

When both of the address signals CA1, CA2 are at the "L" level, the output signal of AND circuit CAD1 attains the "H" level, and switch circuit CSW1 fixes column line CL1 at the fixed voltage (in this case, ground voltage). At this occasion, the output signals of AND circuits CAD2, CAD3, CAD4 are at the "L" level, and switch circuits CSW2, CSW3, CSW4 electrically connect column lines CL2, CL3, CL4 to pulse generating circuit 36.

When the address signal CA1 is at the "H" level, and the address signal CA2 is at the "L" level, the output signal of AND circuit CAD2 attains the "H" level, and switch circuit CSW2 fixes column line CL2 at the fixed voltage. At this occasion, the output signals of AND circuits CAD1, CAD3, CAD4 are at the "L" level, and switch circuits CSW1, CSW3, CSW4 electrically connect column lines CL1, CL3, CL4 to pulse generating circuit 36.

When the address signal CA1 is at the "L" level, and the address signal CA2 is at the "H" level, the output signal of AND circuit CAD3 attains the "H" level, and switch circuit CSW3 fixes column line CL3 at the fixed voltage. At this occasion, the output signals of AND circuits CAD1, CAD2, CAD4 are at the "L" level, and switch circuits CSW1, CSW2, CSW4 electrically connect column lines CL1, CL2, CL4 to pulse generating circuit 36.

When both of address signals CA1, CA2 are at the "H" level, the output signal of AND circuit CAD4 attains the "H" level, and switch circuit CSW4 fixes column line CL4 at the fixed voltage. At this occasion, the output signals of AND circuits CAD1, CAD2, CAD3 are at the "L" level, and switch circuits CSW1, CSW2, CSW3 electrically connect column lines CL1, CL2, CL3 to pulse generating circuit 36.

(3) Operation

Operation of a cross-point type resistance change memory as shown in FIGS. 1 and 2 will be explained.

Resistance change element RE has the following property. When a voltage equal to or higher than a certain value is applied to resistance change element RE, resistance change element RE changes from the high resistance state to the low resistance state (set). When a current equal to or higher than a certain value flows through resistance change element RE, resistance change element RE changes from the low resistance state to the high resistance state (reset).

Now, execution of writing to a memory cell between row line RL3 and column line CL2 will be considered. "Writing" means that resistance change element RE is caused to change from the high resistance state to the low resistance state, i.e., set operation.

FIG. 3 illustrates the relationship of voltages in the memory cell array in this case.

All the remaining memory cells except for selected memory cell M (sel) are unselected memory cells.

A voltage pulse +V is applied to selected row line RL3 and unselected column lines CL1, CL3, CL4. A fixed voltage (for example, ground voltage) is applied to unselected row lines RL1, RL2, RL4 and selected column line CL2.

In this case, in selected memory cell M (sel), diode D is in a forward bias state. In selected memory cell M (sel), a voltage equal to or higher than a certain value is applied to resistance change element RE, and a sufficiently large current flows therethrough. Therefore, resistance change element RE changes from the high resistance state to the low resistance state.

In each unselected memory cells between selected row line RL3 and one of unselected column lines CL1, CL3, CL4, the voltage pulse +V is applied to row line RL3 and column lines CL1, CL3, CL4. Therefore, no voltage is applied to resistance change element RE, and the state of resistance change element RE does not change.

Likewise, in each of unselected memory cells between one of unselected three row lines RL1, RL2, RL4 and selected column line CL2, the fixed voltage is applied to row lines RL1, RL2, RL4 and column line CL2. Therefore, the state of resistance change element RE does not change.

Further, in each unselected memory cells between one of unselected three row lines RL1, RL2, RL4 and one of unselected three column lines CL1, CL3, CL4, the fixed voltage is applied to unselected three row lines RL1, RL2, RL4, and the voltage pulse +V is applied to unselected three column lines CL1, CL3, CL4. However, since diode D is in the reverse bias state, diode D becomes equivalent to a capacitor, and most of the voltage generated between one of unselected three row lines RL1, RL2, RL4 and one of unselected three column lines CL1, CL3, CL4 is applied to diode D. Therefore, a voltage lower than a certain value is applied to resistance change element RE, and the state of resistance change element RE does not change.

Regarding the relationship between voltage value (maximum value) +V of the voltage pulse and the voltage value of the fixed voltage, the values of neither of them are particularly limited as long as the voltage pulse +V is higher than the fixed voltage. Usually, the voltage pulse +V is set at a positive voltage. At this occasion, the fixed voltage is preferably set at the ground voltage (0 V).

Let a voltage needed for writing (set operation) be Vset, a voltage needed for erasing (reset operation) be Vreset, and a voltage needed for reading be Vread. Then, the relationship between these voltages is represented as Vread<Vreset<Vset.

The cross-point type resistance change memory is based on the above principle, and ideally execute reading/writing/erasing operations of only selected memory cell M (sel) while preventing interference between the cells.

(4) Structure of Memory Cell

FIG. 4 illustrates an example of a structure of a memory cell.

FIG. 4A illustrates a planar shape of the memory cell. FIG. 4B illustrates a cross section of the memory cell.

Memory cell 3 includes resistance change element 11 (RE) and diode 12 (D). Metal electrode 13 is provided between resistance change element 11 (RE) and diode 12 (D). Metal electrode 14 is provided at one end of resistance change element 11 (RE). Metal electrode 15 is provided at one end of diode 12 (D).

For example, resistance change element 11 is made of $ZnMn_2O_4$ having a thickness of about 10 nm. For example, metal electrodes 13, 14, 15 are made of TiN. TiN serves not only as a conductive material but also as a barrier metal for preventing interdiffusion of atoms.

Metal electrode 14 is connected to a row line, and metal electrode 15 is connected to a column line. For example, row line and column lines are made as a stacked structure including W and TiN.

The most significant feature of this embodiment lies in the structure of diode 12 (D).

In this specification, a commonly-used notation is used. Conductive types of semiconductors are denoted with "p" and "n". The magnitude of the impurity concentration in a semiconductor is denoted with "+" and "−". According to this notation, the structure of diode 12 (D) is described as $p^+/n^-/n^+$, for example. It should be noted that "/" denotes an interface. The left side of "/" is a row line side (for example, an upper side). The right side of "/" is a column line side (for example, a lower side).

More specifically, diode 12 (D) includes $n^+$-type semiconductor area 16, $n^-$-type semiconductor area 18, and $p^+$-type semiconductor area 17, which are arranged from the column line side to the row line side. $n^-$-type semiconductor area 18 has a lower atom density of n-type impurity than that of $n^+$-type semiconductor area 16. $p^+$-type semiconductor area 17 is opposite to the n-type.

Further, in the embodiment, diode 12 (D) has n-type semiconductor areas 19 at ends of $n^-$-type semiconductor area 18 in a direction perpendicular to a direction from the column line side to the row line side, wherein n-type semiconductor area 19 has a higher atom density of n-type impurity than that of $n^-$-type semiconductor area 18.

The atom density of n-type impurity of n-type semiconductor area 19 is preferably lower than that of $n^+$-type semiconductor area 16. n-type semiconductor areas 19 are preferably arranged at the ends of $n^-$-type semiconductor area 18 in a direction perpendicular to the direction from the column line side to the row line side, wherein n-type semiconductor area 19 extends over half of $n^-$-type semiconductor area 18 at a side closer to $n^+$-type semiconductor area 16.

Figure 5:
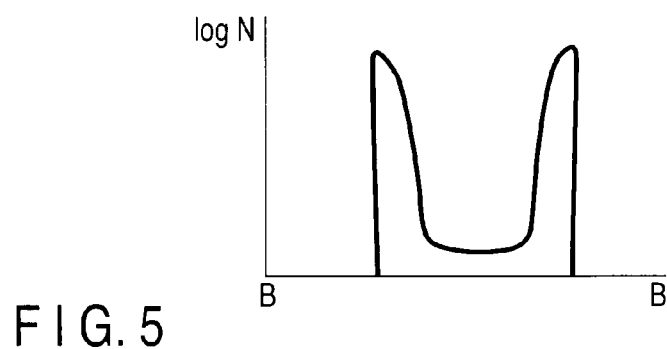
FIG. 5 shows an impurity concentration distribution.

As described above, in the embodiment, n-type semiconductor areas 19 are provided at the ends of $n^-$-type semiconductor area 18 in a direction perpendicular to the direction from the column line side to the row line side. FIG. 5 illustrates a graph representing an impurity concentration distribution in a cross section taken along line B-B of FIG. 4B. In FIG. 5, a horizontal axis represents a position, and a vertical axis represents an impurity concentration N.

The reason why this kind of structure is employed will be explained below.

When a cell size of an ReRAM using resistance change elements is several dozen nanometers, a large current of 1 to 10 μA or 10 μA or more per cell is required in a reset operation in which the memory cell changes from the low resistance state to the high resistance state When the diode is caused to function as a selection element, this kind of large current preferably flows with a low loss. However, where the impurity concentration is assumed to be uniform in the $n^-$-type semiconductor area as in the conventional examples, a tolerable current and a carrier scattering are as follows. When the impurity concentration is high, the tolerable current increases, and the carrier scattering increases, resulting in a higher loss. On the other hand, when the impurity concentration is low in the $n^-$-type semiconductor area, the carrier scattering decreases to result in a lower loss, and the tolerable current decreases.

In the embodiment, the $n^-$-type semiconductor area has the impurity concentration distribution in the direction from the column line to the row line, i.e., the direction perpendicular to the direction in which $p^+/n^-/n^+$ are stacked, thus solving the tradeoff problem.

In other words, in $n^-$-type semiconductor area 18 residing in a central portion of the diode, the impurity concentration is set at a low value, so that the carrier scattering is reduced, and the current loss is reduced. Accordingly, carriers are mainly transported through $n^-$-type semiconductor area 18 serving as the carrier transport area.

Further, in order to compensate for the lack of carriers resulting from the low impurity concentration, n-type semiconductor areas 19 serving as the carrier supply areas are arranged adjacent to $n^-$-type semiconductor area 18 serving as the carrier transport area. n-type semiconductor areas 19 are disposed in a direction perpendicular to a direction in which the carriers are transported.

In this case, the carriers are diffused naturally according to a gradient of the impurity concentration.

Therefore, when the cell size is several dozen nanometers or less, carriers diffused from n-type semiconductor areas 19 serving as the carrier supply areas can reach the entire $n^-$-type semiconductor area 18 serving as the carrier transport area. In other words, the carrier transport area allows electrical conduction with a sufficient number of carriers while the scattering is suppressed.

As a result, the diode can be provided, through which a sufficient amount of tolerable current can flow with a low loss.

More specifically, when the diode is constituted by silicon, the impurity concentration of the n-type impurity (for example, phosphorus) in $n^-$-type semiconductor area 18 serving as the carrier transport area is set at about $1 \times 10^{16}$ cm$^{-3}$ (average value), and the impurity concentration of the n-type impurity (for example, phosphorus) in the n-type semiconductor area 19 serving as the carrier supply area is set at about $1 \times 10^{18}$ cm$^{-3}$ (average value).

The impurity concentration of the p-type impurity (for example, boron) in $p^+$-type semiconductor area 17 is set at about $1 \times 10^{21}$ cm$^{-3}$ (average value), and the impurity concentration of the n-type impurity (for example, phosphorus) in the $n^+$-type semiconductor area 16 is set at about $1 \times 10^{20}$ cm$^{-3}$ (average value)

A width of $n^-$-type semiconductor area 18 serving as the carrier transport area in the direction perpendicular to the direction in which $p^+/n^-/n^+$ are stacked (for example, where a planar shape is a square, a width in a direction parallel with each side of the square) is set at about 16 nm. A width in the same direction of n-type semiconductor areas 19 serving as the carrier supply areas is set at about 3 nm (since n-type semiconductor areas 19 are arranged on either side, the total width is 6 nm).

The impurity atom density in the semiconductor area need not be defined in units of the crystal lattice positions of the atoms constituting the semiconductor. An average number of impurity atoms per area of about 2 to 3 nm is more significant. This is based on the following physical consideration. Carriers flowing though a diode are dependent on an electric potential field formed in the semiconductor area. An effective extension of the potential field made by impurity atoms can be defined using a so-called Bohr radius in first approximation.

Let a relative permittivity be ϵr, and an effective mass ratio be me/m. This Bohr radius is given as [ϵr/(me/m)]×a0 based on the Bohr radius of hydrogen atom a0=0.0528 nm. When silicon is used as the semiconductor, the relative permittivity ϵr is known to be 11.7, and the effective mass ratio me/m is known to be about 0.2 to 0.3. Accordingly, the Bohr radius is derived as 2 to 3 nm.

Therefore, as described above, when the average number of impurity atoms is determined in a range of 2 to 3 nm, the current flowing through the diode can be determined. Accordingly, the impurity concentrations in the carrier transport area and the carrier supply area may be defined using average concentrations in the range of 2 to 3 nm in the respective areas, and the interface therebetween may be considered to be an area having a width of about 2 to 3 nm.

In the present embodiment, the conductive type of the carrier transport area and the carrier supply area is assumed to be n-type. Alternatively, the conductive type may be p-type. In this case, the conductive type of the semiconductor areas provided on either side of the diode is also changed accordingly.

In other words, the structure of the diode according to the embodiment is not limited to $p^+/n^-/n^+$. In addition to $p^+/n^-/n^+$, the structure of the diode according to the embodiment may be, for example, $p^+/p^-/n^+$, $n^+/n^-/p^+$, $n^+/p^-/p^+$, and the like.

Further, in the embodiment, the carrier supply areas are arranged to enclose the carrier transport area. Alternatively, the carrier supply areas may be provided so as to sandwich the carrier transport area, the carrier supply area may be provided only at one end of the carrier transport area, or the carrier supply area may be provided in a central portion of the carrier transport area.

The diode may be a PN-junction diode constituted by silicon or PN-junction diode constituted by SiGe alloy. The planar shape of the memory cell may be any shape such as a square, a rectangle, a circle, and an ellipse.

(5) Memory Cell Array Structure

Figure 6:
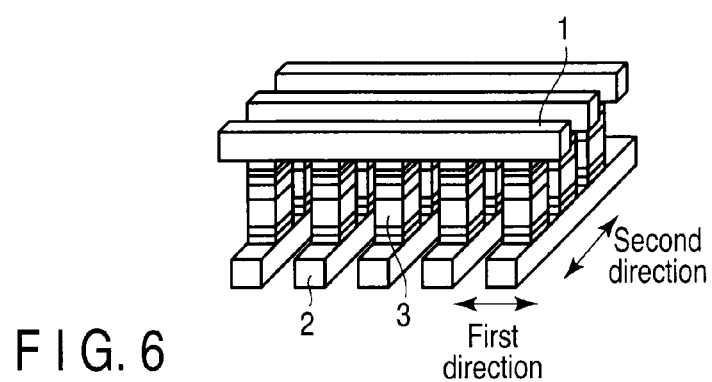
FIG. 6 shows a memory cell array.

FIG. 6 illustrates an example of a memory cell array structure.

Row lines 1 lie directly on memory cells 3. Column lines 2 lie directly under memory cells 3. For example, each of row line 1 and column line 2 has a structure in which W and TiN are stacked.

For example, each of the pitch of row line 1 and the pitch of column line 2 is about 44 nm. In other words, each of the width of the row line 1 and the width of the column line 2 is about 22 nm. Each of the space between row lines 1 and the space between column lines 2 is about 22 nm. The cell size of the planar shape of memory cell 3 is about 22 nm by about 22 nm.

In this structure, row line 1 and column line 2 are simply made of a line-and-space pattern. Accordingly, it is not necessary to consider displacement in the direction perpendicular to the direction in which row lines 1 or column lines 2 extend. Therefore, the accuracy of positioning within a memory cell array may be reduced to an extremely low level, which enables easy manufacturing of the memory cell array.

(6) Manufacturing Method

Method for manufacturing a memory cell and a memory cell array as shown in FIGS. 4 to 6 will be explained.

Figure 7:
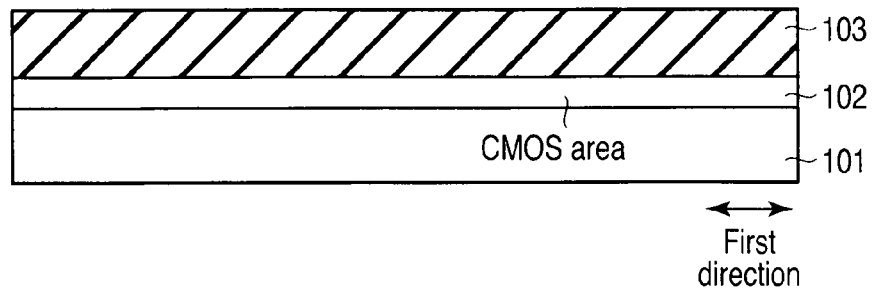

First, as shown in FIG. 7, CMOS area 102 provided with CMOS circuits is formed on a main surface of silicon substrate 101 having a thickness of about 720 μm using an ordinary CMOS process. CMOS area 102 includes P-channel MOSFETs, N-channel MOSFETs, wiring layers, and a connection portion for connecting the wiring layers.

After CMOS area 102 is formed, insulating film 103 having a thickness of about 300 nm constituted by $SiO_2$ is formed on CMOS area 102 using a CVD method mainly using TEOS.

Figure 8:
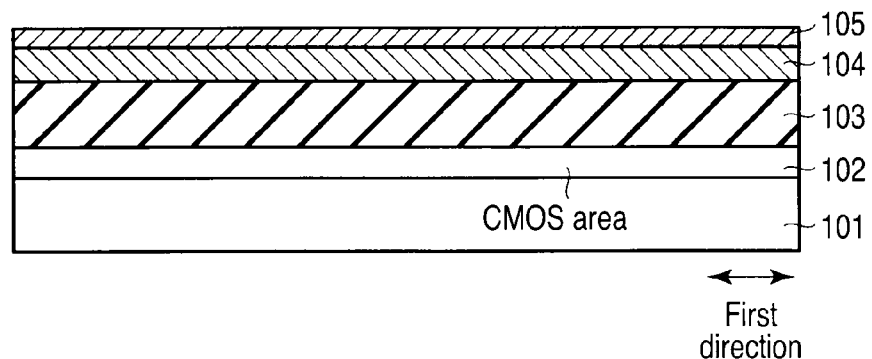

Subsequently, as shown in FIG. 8, composite film 104 including TiN having a thickness of about 10 nm and W having a thickness of about 50 nm is formed on insulating film 103 using a sputtering method. Further, metal film (electrode) 105 including TiN having a thickness of about 10 nm is formed on composite film 104 using a sputtering method. Metal film 105 has a function of a barrier metal for preventing diffusion of impurities which are not needed in the diode.

Figure 9:
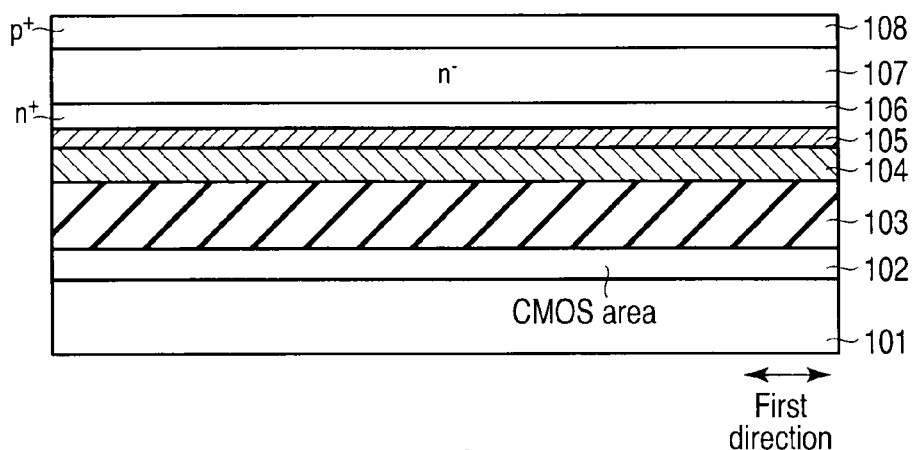

Subsequently, as shown in FIG. 9, an amorphous silicon film is formed using an LPCVD method mainly using $SiH_4$.

First, a very small quantity of $PH_3$ is doped to form $n^+$-type semiconductor area 106 having a thickness of about 10 nm including phosphorus of about $1\times10^{20}$ $cm^{-3}$. Subsequently, supply of $SiH_4$ and $PH_3$ gasses are temporarily stopped, and only carrier gas Ar is caused to flow, so that the remaining phosphorus concentration in the reactor is sufficiently reduced. Thereafter, $SiH_4$ and an extremely small quantity of $PH_3$ are supplied again, thus forming $n^-$-type semiconductor area 107 having a thickness of about 80 nm including phosphorus of about $1\times10^{16}$ $cm^{-3}$.

Then, supply of $SiH_4$ and $PH_3$ gasses are temporarily stopped again, and only carrier gas Ar is caused to flow, so that the remaining phosphorus concentration in the reactor is sufficiently reduced, and the temperature in the reactor is reduced by 75 degrees Celsius. Then, when the temperature becomes stable, $SiH_4$ and a small quantity of $BCl_3$ are supplied, thus forming $p^+$-type semiconductor area 108 having a thickness of about 10 nm including boron of about $1\times10^{21}$ $cm^{-3}$.

The reason why the temperature in the reactor (deposition temperature) is reduced is that boron accelerates the reaction of $SiH_4$, and this facilitates control of the film thickness. The reason why the concentration of boron is higher than the concentration of the phosphorus is to compensate for the phenomenon that the $p^+$-type semiconductor area 108 is more difficult to have a smaller resistance value than the $n^+$-type semiconductor area 106.

The thicknesses of $n^+$-type semiconductor area 106, $n^-$-type semiconductor area 107, and $p^+$-type semiconductor area 108 are respectively determined in view of a thermal process carried out later. More particularly, the thicknesses are determined in view of diffusion of impurities occurring in a high temperature process carried out for the purpose of activating the impurities and crystallization of amorphous silicon.

In other words, in the final stage after all the manufacturing steps, the thicknesses of $n^+$-type semiconductor area 106 and $p^+$-type semiconductor area 108 increase by about 20 nm, but the thickness of $n^-$-type semiconductor area 107 decreases by about 40 nm. The above thicknesses are set in view of these effects in advance.

Figure 10:
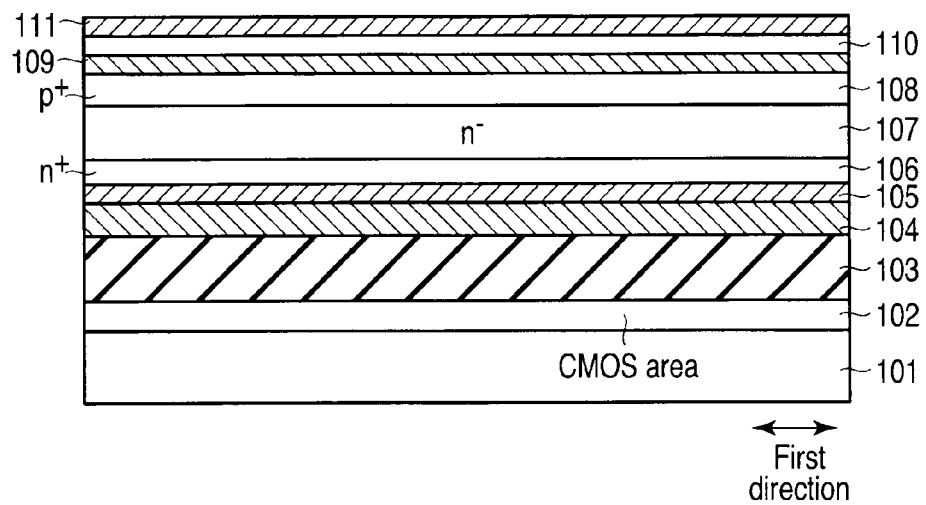

Subsequently, as shown in FIG. 10, metal film (electrode) 109 including TiN having a thickness of about 10 nm, resistance change material 110 constituted by $ZnMn_2O_4$ having a thickness of about 10 nm, and metal film (electrode) 111 including TiN having a thickness of about 10 nm are successively formed on $p^+$-type semiconductor area 108 using a sputtering method.

Metal films 109, 111 serve not only as electrodes of resistance change material 110 but also as a barrier metal for preventing diffusion of impurities.

Figure 11:
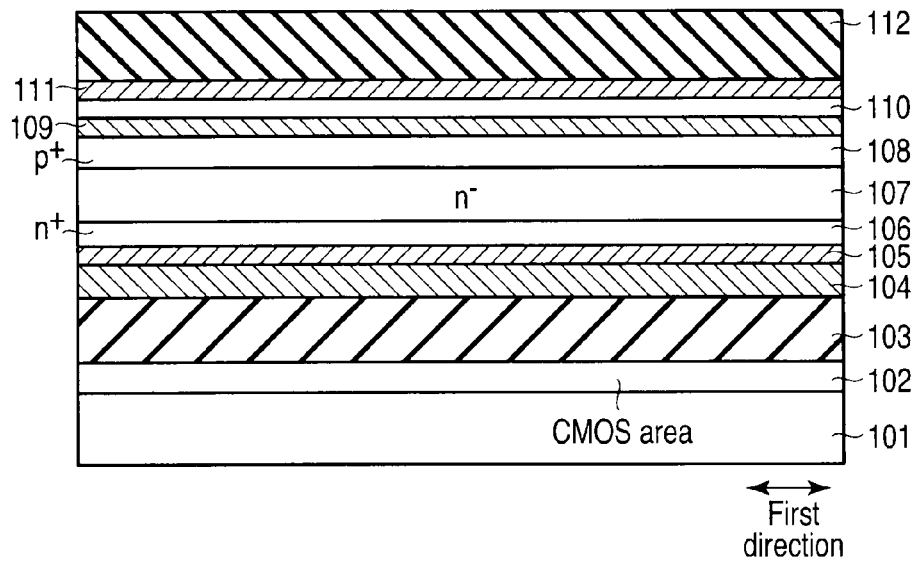

Subsequently, as shown in FIG. 11, insulating film 112 having a thickness of about 150 nm constituted by $SiO_2$ is formed on metal film 111 using a CVD method mainly using TEOS.

Subsequently, as shown in FIG. 12, resist patterns extending in a vertical direction with respect to the surface of this paper are formed with a pitch of about 44 nm using an Imprint Lithography technique. Using the resist pattern as a mask, insulating film 112 is patterned by reactive ion etching using $CHF_3$ and CO gasses. Thereafter, the resist pattern is removed.

Then, using insulating film 112 as a mask, metal film 111, resistance change material 110, metal film 109, $p^+$-type semiconductor area 108, $n^-$-type semiconductor area 107, $n^+$-type semiconductor area 106, and metal film 105 are successively patterned by reactive ion etching using $Cl_2$, Ar, and Co gasses.

Further, composite film 104 including TiN and W is patterned using reactive ion etching using $CHF_3$ and $SF_6$ gasses.

At this stage, composite film 104 is formed as column lines extending in the direction perpendicular to the surface of this paper.

Subsequently, as shown in FIG. 13, PSG film 113 constituted by silicon oxide including a large quantity of phosphorus is formed by a CVD method. PSG film 113 completely fills grooves between insulating films 112. At this occasion, the deposition temperature is set at about 450 degrees Celsius, so as to prevent phosphorous in PSG film 113 from diffusing into semiconductor areas 106, 107, 108 and resistance change material 110.

Subsequently, as shown in FIG. 14, PSG film 113 is etched back to a predetermined position using reactive ion etching using $CHF_3$ and CO gasses.

In this case, the predetermined position is such that the upper surface of PSG film 113 is higher than the lower surface of $n^-$-type semiconductor area 107 but is lower than the upper surface of $n^-$-type semiconductor area 107.

At this occasion, the upper portion of insulating film 112 is also etched. However, insulating film 112 is not eliminated as long as the etching condition is set such that an etching rate of PSG film 113 is larger than that of insulating film 112.

Subsequently, as shown in FIG. 15, a thermal process is performed at 600 degrees Celsius, and phosphorous is diffused from PSG film 113 into $n^-$-type semiconductor area 106 in solid phase.

The range in which the phosphorous is thus diffused in a solid phase is sufficiently short. Therefore, n-type semiconductor areas 114 including phosphorous of about $1 \times 10^{18}$ $cm^{-3}$ are formed only in lower side-surfaces of $n^-$-type semiconductor areas 106 (only two lower side-surfaces in the lateral direction of this paper).

In other words, n-type semiconductor areas 114 are respectively formed at two end portions in a direction (first direction) in which a composite film (row lines), explained later, extend.

Thereafter, reactive ion etching using $CHF_3$ and CO gasses is performed again, and PSG films 113 remaining in the grooves between insulating films 112 are completely removed. As a result, the structure as shown in FIG. 16 is obtained.

Figure 18:
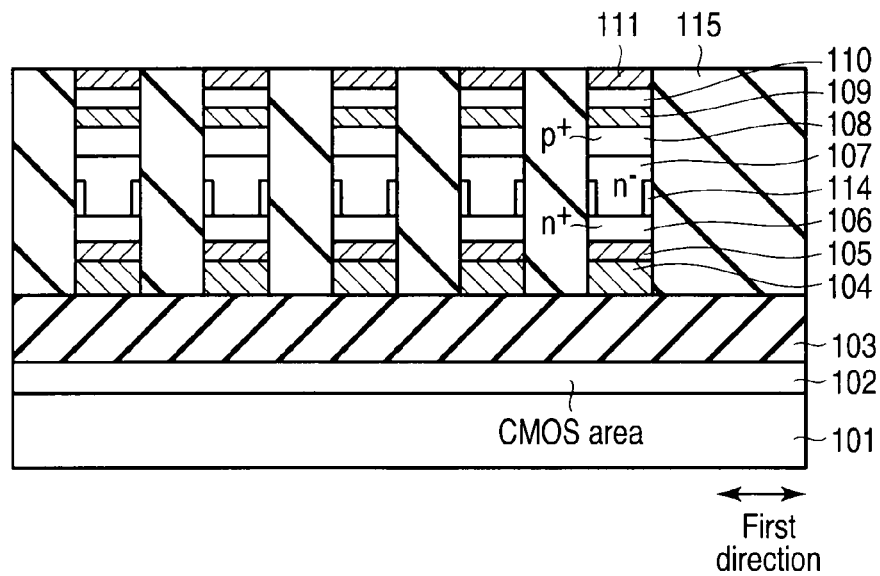

Subsequently, as shown in FIG. 17, insulating film 115 constituted by $SiO_2$ is formed using a CVD method mainly using TEOS. Insulating film 115 completely fills grooves between insulating films 112. As shown in FIG. 18, insulating films 112, 115 are ground by a CMP method using metal film 111 as a stopper. As a result, the upper surface of insulating film 115 is smoothed, and has substantially the same position as the upper surface of metal film 111.

Figure 19:
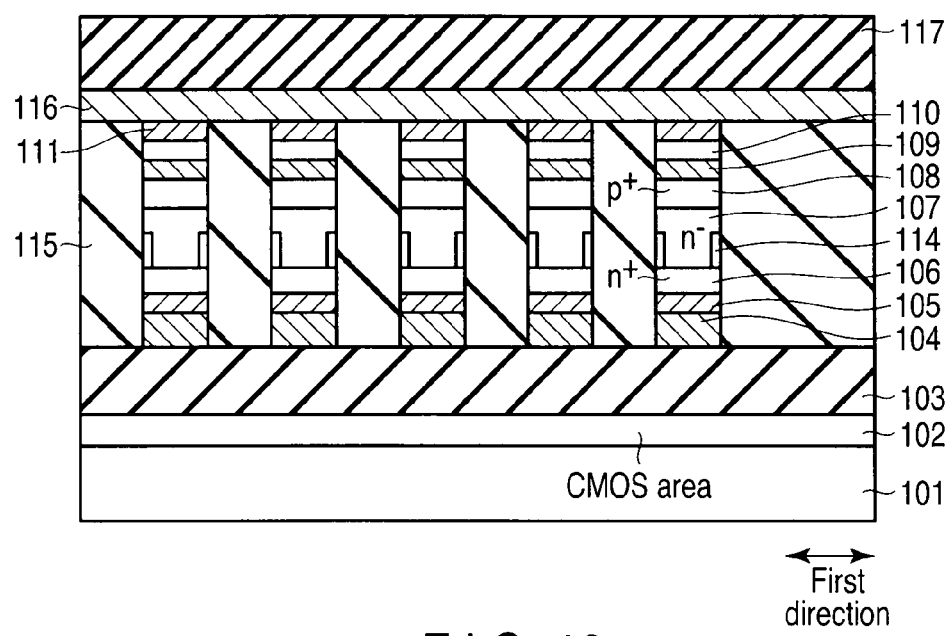

Subsequently, as shown in FIG. 19, composite film 116 including TiN having a thickness of about 10 nm and W having a thickness of about 50 nm is formed by a sputtering method on metal film 111 and insulating film 115. Subsequently, insulating film 117 constituted by $SiO_2$ is formed by a CVD method mainly using TEOS.

Thereafter, a resist pattern extending in the lateral direction of this paper is formed with a pitch of about 44 nm using an Imprint Lithography technique. Using this resist pattern as a mask, insulating film 117 is patterned using reactive ion etching using $CHF_3$ and CO gasses. Thereafter, the resist pattern is removed.

Then, using insulating film 117 as a mask, composite film 116 including TiN and W is patterned by reactive ion etching using $CHF_3$ and $SF_6$ gasses.

At this stage, composite film 116 becomes row lines extending in the lateral direction of the paper.

Subsequently, metal film 111, resistance change material 110, metal film 109, $p^+$-type semiconductor area 108, $n^-$-type semiconductor area 107, $n^+$-type semiconductor area 106, and metal film 105 are successively patterned by reactive ion etching using $Cl_2$, Ar, and CO gasses.

As a result of the patterning, square pillar-shaped memory cells are formed between composite films 104 serving as column lines and composite films 116 serving as row lines.

Thereafter, a spin-coatable silicon oxide film, not shown, is formed on the entire surface of the wafer while filling the grooves. Subsequently, connection portions for coming into contact with CMOS circuits in CMOS area 102 are formed by a lithography process and reactive ion etching.

When memory cell arrays are stacked, the above steps may be repeated multiple times. Finally, thermal treatment is carried out at about 800 degrees Celsius for about five seconds, so that the amorphous silicon is crystallized, and at the same time, the impurities are activated. Further, a passivation film is formed, and after wiring connection portions serving as input/output units are formed, so-called post-processes such as an inspection process and dicing process are carried out. Thus, the resistance change memory is completed.

In this manufacturing method, the CVD film (silicon film) doped with the impurities is used when the diodes are formed. Alternatively, the diodes may be formed by ion-implanting impurity atoms into a CVD film not doped with impurities.

In this manufacturing method, phosphorous is used as the n-type impurity. Alternatively, arsenic may be used instead of phosphorous.

When $p^-$-type semiconductor areas (carrier transport areas) are used instead of the $n^-$-type semiconductor areas (carrier transport areas), $BCl_3$ gas is applied to form the $p^-$-type semiconductor areas. In order to form p-type semiconductor areas (carrier supply areas), a BSG film, i.e., $SiO_2$ film including boron, may be used instead of the PSG film.

Further, in FIG. 19, n-type semiconductor areas 114 may be formed as follows. After composite film (row lines) 116, and memory cells are formed, n-type semiconductor areas 114 may be formed by a method such as solid phase diffusion.

In this case, n-type semiconductor areas 114 are formed at two lower side surfaces of n⁻-type semiconductor area 106 in a direction perpendicular to this paper.

In other words, as shown in FIG. 20, n-type semiconductor areas 114 are respectively formed at two ends in a direction (second direction) in which composite film (column lines) extends.

When n-type semiconductor areas 114 are respectively formed in two steps, i.e., the step of FIG. 15 and the step of FIG. 20, n-type semiconductor areas 114 are formed to enclose n⁻-type semiconductor area 106.

3. APPLICATION EXAMPLE

FIG. 21 is a perspective view illustrating a resistance change memory as an example of application.

CMOS layer 52 including a CMOS circuit is formed on a semiconductor substrate (for example, silicon substrate) 51. Memory cell layer 53 including memory cells is formed on CMOS layer 52.

Reference numeral 54 denotes a memory cell array area. Reference numeral 55 denotes an input/output (I/O) area. Peripheral circuits are formed in CMOS layer 52.

CMOS circuit is formed with a wider pitch, e.g., 90 nm design rule, than a pitch of row lines and column lines in memory cell layer 53 except for connection portions with the memory cells. The size of the memory cell array area is, for example, 22 μm×22 μm, in which area 512×512 memory cells (intersecting points between row lines and column lines) are formed.

Memory cell array area 54 is called a block. Multiple blocks are arranged in a matrix form.

CMOS layer 52 and memory cell layer 53 are connected with each other via through-holes.

In the resistance change memory as described above, memory cell layer 53 can be formed on CMOS layer 52. The resistance change memory is not limited to having only one memory cell layer 53. It may have multiple memory cell layers 53. Therefore, a large memory capacity can be ensured without increasing the size of the chip area.

Input/output area 55 includes pads formed thereon. In an assembly step, lead frames and the pads are connected with, e.g., bonding wires.

The resistance change element constituting the memory cell is made of one material selected from the group consisting of $ZnMn_2O_4$, NiO, $TiO_2$, $SrZrO_3$, $Pr_{0.7}Ca_{0.3}MnO_3$.

An electrode coming into contact with the resistance change element is made with TiN or TaN. An electrode coming into contact with the resistance change element may be $TiO_2$ doped with Nb, Pt, W, or WN.

The diode connected in series with the resistance change element may be a PN-junction diode formed with silicon monocrystals. Alternatively, it may be made with a PN-junction diode formed with SiGe alloy, Schottky diode, and the like.

For example, when the resistance change element is made of $ZnMn_2O_4$ having a thickness of 15 nm, one end of the resistance change element is connected to a row line made of W via an electrode made of TaN. The other end of the resistance change element is connected to a P layer (anode layer) of a PN-junction diode on a silicon substrate via an electrode made of TiN. An N layer (cathode) of the PN-junction diode is connected to a column line made of W via an electrode made of TiN.

Each of the pitch of row lines and the pitch of column lines is 44 nm, i.e. it is constituted by a line having a line width of 22 nm and a space of 22 nm. The planar size of the resistance change element is, for example, 22 nm×22 nm.

4. CONCLUSION

According to the embodiment, in the diode constituting the memory cell of the resistance change memory, both of the tolerable value of the current flowing in the forward direction and the loss caused by the carrier scattering can be improved at the same time.

This embodiment is effective for resistance change memories such as ReRAM using resistance change elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance change memory comprising:
row lines extending in a first direction;
column lines extending in a second direction cross to the first direction;
memory cells each comprising a resistance change element and a diode connected in series, and each memory cell provided between one of the row lines and one of the column lines;
a first decoder which selects one of the row lines as a selected row line;
a second decoder which selects one of the column lines as a selected column line; and
a voltage pulse generating circuit which generates a voltage pulse supplying between the selected row line and the selected column line in a writing,
wherein the diode comprises areas which is provided in order of a first semiconductor area with a first conductivity type, a second semiconductor area with the first conductivity type, and a third semiconductor area with a second conductivity type, from the column lines to the row lines,
wherein an atom density of impurities with the first conductivity type in the second semiconductor area is lower than that in the first semiconductor area,
wherein the diode comprises a fourth semiconductor area with the first conductivity type at an end portion in a third direction of the second semiconductor area, the third direction is perpendicular to a direction from the column lines to the row lines, and an atom density of impurities with the first conductivity type in the fourth semiconductor area is higher than that in the second semiconductor area.

2. The memory of claim 1,
wherein the atom density of impurities with the first conductivity type in the fourth semiconductor area is lower than that in the first semiconductor area.

3. The memory of claim 1,
wherein the fourth semiconductor area is provided in a half of the first semiconductor area side among the end portion in the third direction of the second semiconductor area.

4. The memory of claim 1,
wherein the fourth semiconductor area is provided at two end portions in a direction in which the row lines extend.

5. The memory of claim 1,
wherein the fourth semiconductor area is provided at two end portions in a direction in which the column lines extend.

6. The memory of claim 1,
wherein the fourth semiconductor area surrounds the second semiconductor area.

7. The memory of claim 1,
wherein the fourth semiconductor area of the diode has a width in the third direction of 100 nm or less.

* * * * *